US010371741B2

(12) United States Patent
McAleenan

(10) Patent No.: US 10,371,741 B2
(45) Date of Patent: Aug. 6, 2019

(54) CHARACTERIZATION OF PHASE SHIFTER CIRCUITRY IN INTEGRATED CIRCUITS (ICS) USING STANDARD AUTOMATED TEST EQUIPMENT (ATE)

(71) Applicant: Advantest Corporation, Tokyo (JP)

(72) Inventor: Roger McAleenan, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 322 days.

(21) Appl. No.: 15/207,341

(22) Filed: Jul. 11, 2016

(65) Prior Publication Data

US 2018/0011171 A1 Jan. 11, 2018

(51) Int. Cl.
*G01R 31/28* (2006.01)
*G01S 13/93* (2006.01)
*G01S 13/02* (2006.01)

(52) U.S. Cl.
CPC ..... *G01R 31/2822* (2013.01); *G01R 31/2834* (2013.01); *G01S 13/931* (2013.01); *G01S 2013/0245* (2013.01); *G01S 2013/0254* (2013.01)

(58) Field of Classification Search
CPC ............... G01R 31/2822; G01S 13/931; G01S 2013/0245; G01S 2013/0254
USPC ........................................................ 342/165
See application file for complete search history.

(56) References Cited

U.S. PATENT DOCUMENTS

| 4,649,390 | A  | * | 3/1987 | Andrews ............... G01S 13/426 342/140 |
| 6,211,663 | B1 | * | 4/2001 | Moulthrop ......... G01R 31/2822 324/615 |
| 2002/0109681 | A1 | * | 8/2002 | Elber ...................... G06T 17/30 345/418 |
| 2005/0073461 | A1 | * | 4/2005 | Norvell ................... H01Q 3/30 343/700 MS |
| 2011/0037404 | A1 | * | 2/2011 | Hollingsworth ........ H01J 65/04 315/248 |
| 2017/0307732 | A1 | * | 10/2017 | Haghighi ............... G01S 7/4052 |

* cited by examiner

*Primary Examiner* — Frank J McGue

(57) ABSTRACT

A method for characterizing a phase shifter in a device under test (DUT) using automated test equipment (ATE) is disclosed. The method comprises down converting an input signal received from the transmitter DUT to an intermediate frequency and routing the down converted input signal to a signal processor, wherein the signal processor generates I and Q signals using the input signal. The method further comprises setting an initial phase state on the phase shifter in the transmitter DUT and toggling at least one phase state bit to control the phase shifter to cycle through a plurality of phase states, wherein the changing phase states appear on the I and Q signals. Finally, the method comprises processing the I and Q signals to extract individual phase states programmed by the at least one phase state bit.

20 Claims, 11 Drawing Sheets

CHARACTERIZATION OF PHASE SHIFTER CIRCUITRY IN INTEGRATED CIRCUITS (ICS) USING STANDARD AUTOMATED TEST EQUIPMENT (ATE)

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

In general, components, for example, electronic components or devices, micro-electronic chips, memory chips or other integrated circuits (IC), are usually tested before they are delivered to a customer. Testing may be performed in order to prove and ensure the correct functional capability of the devices. The tests are usually performed by means of an automated test equipment or test system. Examples for such ATE are the Advantest V93000 SOC for testing system on a chip and system on a package, the V93000 HSM high speed memory tester (HSM) for testing high speed memory devices and the Advantest V5000 series. The first is a platform for testing systems on a chip, systems on a package and high-speed memory devices. The latter is for testing memory devices including flash memory and multi-chip packages at wafer sort and final test.

During testing these devices under test (DUTs) are exposed to various types of stimulus signals from an ATE. The responses from such devices under test are measured, processed and compared to an expected response by the ATE. Testing may be carried out by automated test equipment, which usually performs testing according to a device specific test program or test flow. Such an automatic test system may comprise different drivers for driving certain stimuli to a DUT, in order to stimulate a certain expected response from the device under test. Receiver units of the ATE may analyze the response and generate a desired output regarding the performance of the measured device.

ATE systems can perform a number of test functions on a device under test (DUT) through the use of test signals transmitted to and coming from the DUT. The DUT interface board is docked to the ATE system by a mechanical system that secures the board and makes electrical contact using, for example, a interconnect system of pogo blocks and blind mate RF SMP connectors. An SMP connector offers a typical frequency range of DC to 40 GHz and is commonly used in miniaturized high frequency coaxial modules. The ATE can interface to and test semiconductor devices in package or wafer form.

ATE systems can perform a number of test functions on a device under test (DUT) through the use of test signals transmitted to and from the DUT. Conventional ATE systems are very complex electronic systems and generally include resources such as digitizers, computers, and digital control hardware to analyze the resulting signals transmitted to or from the DUT to the tester testing session. Modulated test signals to or from the DUT at high frequencies are commonly analyzed for the modulation errors and characteristics of the DUT. Modern mobile phone transceivers are a good example of how the ATE can be employed to test modulation errors and characteristics of the DUT transceivers. Hence, modern ATE systems need to analyze the modulated signals of common lower frequency DUTs such as cellular telephone and Bluetooth using software libraries (API). This requires that a modulated signal is sent to the device or the transmitter itself provides the modulation. It is common for a phase shifter test to be incorporated in the design of the receivers and transmitters for beam-forming and signal identification. However, phase shifters cannot be easily tested without a full vector analyzer available, which is difficult to implement in ATE or to apply effectively in a production environment to a transmitted signal modified by the phase shifter.

Automotive radar applications incorporate phase shifters into the DUT, which requires a different approach for testing. These phase shifters can be controlled by external commands sent to the device. Setting a particular phase change in a high frequency transmitter causes the phase changes that may be required for a beam forming application, and the changes must be measured accurately and quickly. Automotive radar transmitters and receivers may both have phase shifters commonly incorporated within them. Testing each transmitter or receiver requires that each state (setting) of the phase of the phase shifter is tested and recorded against the expected value set by the control programming. This process can be time-consuming and inefficient. Further, as mentioned above, the bench equipment required to perform this testing can be expensive and may not be as useful as connecting to the DUTs may be impractical (e.g., there may be no ports available). Additionally, the bench equipment must create a known reference signal (with a known phase and timing) so that the output signal from the DUT phase shifter can be compared against it. Furthermore, when multiple signal paths need to be tested on a DUT, testing each and every phase shifter setting can be time-prohibitive. As a result, prior methods of testing DUT phase shifters, which were quite difficult to implement and capital intensive were typically performed only on the laboratory bench.

SUMMARY OF THE INVENTION

Accordingly, a need exists for an apparatus and/or method that can implement the required tests and address the problems with the approaches described above. Using the beneficial aspects of the apparatus and/or method described, without their respective limitations, embodiments of the present disclosure provide a novel solution to address these problems.

Embodiments of the present invention provide a method of testing device under test (DUT) phase shifters. Embodiments of the present invention reduce the complexity of testing phase shifter testing by providing several features. For example, among other features, embodiments of the present invention provide a visual indication of the manner in which the DUT phase shift states are occurring, e.g., using time-domain plots. Further, embodiments of the present invention calculate metrics related to the actual performance of the phase shifts relative to the expected results, and determine empirical results of the incremented phase state(s) and distribution of results around each phase state. Furthermore, the record of the phase shift states allow embodiments of the present invention to confirm the functionality and performance of the DUT.

As indicated above, embodiments of the present invention provide a method and apparatus for testing phase shifters. In one embodiment, the present invention is implemented by stimulating the DUT with various physical digital patterns of the control bits of the individual phase shifters in the device or through downloaded codes into registers of the device, wherein programming the device with downloaded codes can replicate external control. A graphical solution of the phase shift along with data for each phase shifter state is created either for a simple two-phase state process or for where multiple phase states are created. As mentioned previously, earlier approaches for measuring the phase shift in production were quite difficult to implement, capital intensive, and typically could only be done on the laboratory bench. Embodiments of the present invention, on the other hand, are implemented using ATE and take advantage of ATE resources and computation power to provide results that are more intuitive and easier to understand and, further, demonstrate actual states of the phase shifters represented, for example, in "degrees" versus time.

In one embodiment, a method for characterizing a phase shifter in a transmitter device under test (DUT) using automated test equipment (ATE) is presented. The method comprises down converting an input signal received from the transmitter DUT to an intermediate frequency and routing the input signal to a signal processor, wherein the signal processor generates I and Q signals using the down converted input signal. The method further comprises setting an initial phase state on the phase shifter in the transmitter DUT and toggling at least one phase state bit to control the phase shifter to cycle through a plurality of phase states, wherein the changing phase states appear on the I and Q signals. Finally, the method comprises processing the I and Q signals to extract individual phase states programmed by the at least one phase state bit.

In another embodiment, a method for characterizing a phase shifter in a receiver device under test (DUT) using automated test equipment is disclosed. The method comprises setting a power level and frequency of an ATE signal generator to transmit an input signal to the receiver DUT and down converting an input signal received from the transmitter DUT to an intermediate frequency. The method also comprises routing the down converted input signal to a signal processor, wherein the signal processor generates I and Q signals using the input signal and setting at least one phase state bit to control the phase shifter to cycle through a plurality of phase states, wherein the changing phase states appear on the I and Q signals. Finally, the method comprises processing the I and Q signals to extract individual phase states programmed by the at least one phase state bit.

In a different embodiment, an Automated Test Equipment (ATE) system is disclosed. The system comprises a memory comprising instructions stored therein, wherein the instructions are operable to characterize a phase shifter in a transmitter device under test (DUT). The system also comprises a processor coupled to the memory, the processor configured to operate in accordance with the instructions to: (a) down convert an input signal received from the transmitter DUT to an intermediate frequency; (b) route the down converted input signal to a signal processor, wherein the signal processor generates I and Q signals using the input signal; (c) set an initial phase state on the phase shifter in the transmitter DUT; (d) toggle at least one phase state bit to control the phase shifter to cycle through a plurality of phase states, wherein changing phase states appear on the I and Q signals; and (e) process the I and Q signals to extract individual phase states programmed by the at least one phase state bit.

In another embodiment, an Automated Test Equipment (ATE) system is presented. The system comprises a memory comprising instructions stored therein, wherein the instructions are operable to characterize a phase shifter in a receiver device under test (DUT) and a processor coupled to the memory, wherein the processor configured to operate in accordance with the instructions to: (a) set an ATE signal generator power level and frequency to transmit an input signal to the receiver DUT; (b) down convert an input signal an intermediate frequency; (c) route the down converted input signal to a signal processor, wherein the signal processor generates I and Q signals using the input signal; (d) set at least one phase state bit to control the phase shifter to cycle through a plurality of phase states, wherein changing phase states appear on the I and Q signals; and (e) process the I and Q signals to extract individual phase states programmed by the at least one phase state bit.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Figure 1:
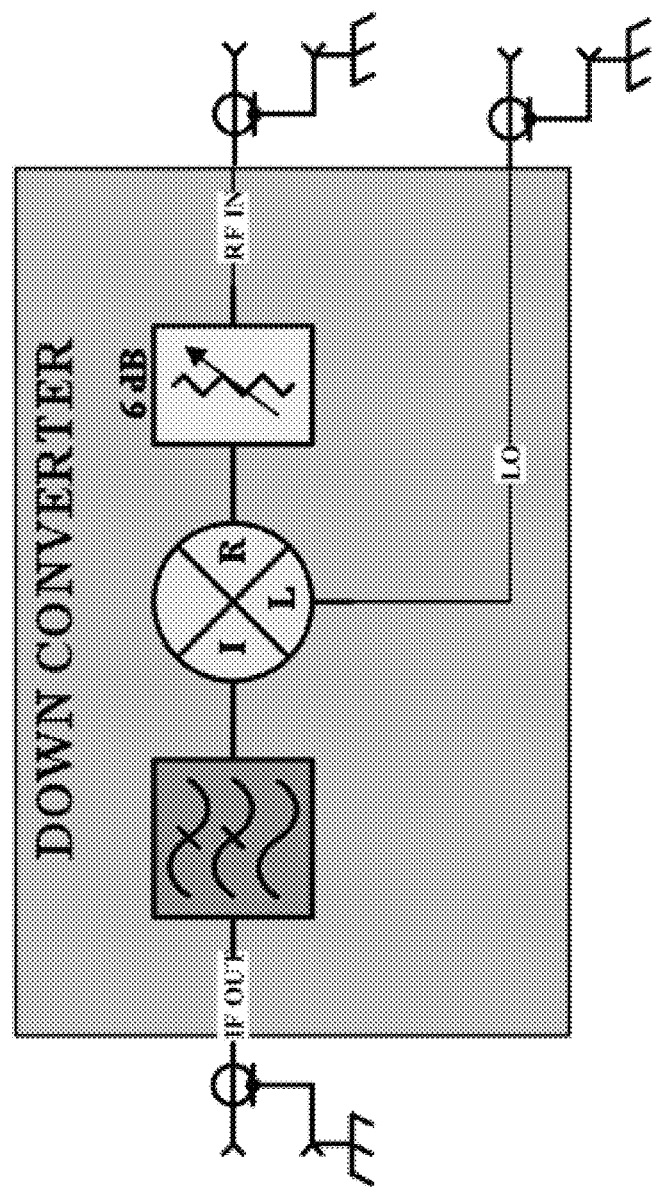
FIG. 1 is an exemplary down converter circuit used to down convert high frequencies in typical radar applications.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Embodiments of the present invention provide a method of testing device under test (DUT) phase shifters. Embodiments of the present invention reduce the complexity of phase shifter testing by providing several features. For example, among other features, embodiments of the present invention provide a visual indication of the manner in which the DUT phase shift states are occurring. Embodiments of the present invention also calculate metrics related to the actual performance of the phase shifts relative to the expected results, and determine empirical results of the incremented phase state(s) and distribution of results around each phase state. Furthermore, a record of the phase shift states confirm the functionality and performance of the DUT.

As indicated above, embodiments of the present invention provide a method and apparatus for testing phase shifters. In one embodiment, the present invention is implemented by manipulating the DUT by inputting various physical digital patterns into the control bits of the individual phase shifters in the device or through downloaded codes into registers of the device, wherein programming the device with downloaded codes can replicate external control. A graphical solution of the phase shift along with data for each phase shifter state is created either for a simple two-phase state process or for where multiple phase states could be created. For example, either a time-domain plot or a constellation diagram can be generated to provide this graphical solution.

As mentioned previously, earlier approaches for characterizing phase shifters were quite difficult to implement, capital intensive, and typically only done on the laboratory bench. Embodiments of the present invention, on the other hand, are implemented using ATE and take advantage of ATE resources and computation power to provide results that are more intuitive and easier to understand and, further, demonstrate actual states of the phase shifters represented in "degrees" versus time.

Typically, both receivers and transmitters, or transceivers (that incorporate both a receiver and a transmitter) can have phase shifters incorporated in the signal path for various application requirements. Embodiments of the present invention provide multiple ways in which the phase shifter can be characterized for each type of device.

Transmitters

Transmitters for certain applications, e.g., automotive radar applications, e.g., proximity detection, etc., typically incorporate phase shifters. Testing each transmitter requires that each state (setting) of the phase of the phase shifter is tested and recorded against the expected value set by the control programming. Furthermore, when multiple signal paths need to be tested on a DUT, testing each and every phase shifter setting is time consuming and difficult. To achieve useful results for typical radar frequency applications, a down conversion to the ATE hardware real time signal processor may be required due to the high frequencies involved which creates the I and Q signals required that indicate the phase changes.

FIG. 1 is an exemplary down converter circuit used to down convert high frequencies in typical radar applications. A system level down conversion as shown in FIG. 1 creates an intermediate frequency (IF). This conversion places the IF signal and corresponding programmed phase shift into the ATE baseband processor where signal processing can be implemented to detect the phase changes with the resolution required for cases where many phase states can be tested. Accordingly, embodiments of the present invention will down convert high frequency signals e.g., automotive radar signals such as 81 GHz, into the frequency ranges with suitable resolution where the phase states can be tested.

Embodiments of the present invention for transmitter tests involve processing a continuous wave (CW) frequency appropriate for the DUT and extracting the corresponding phase shifts created with digital control patterns. The captured response due to the changing phase shifter settings is analyzed with a digital demodulation process at baseband where the phase or frequency phase states are extracted. Digital demodulation algorithms have been commonly used for other modern communication modulation formats generated by the device itself or where the DUT is provided with a known high quality modulation of the correct format (e.g., WCDMA). The signal to or from the DUT in embodiments of the present invention are typically CW, wherein the device phase shifters are rapidly sequenced through the various states by external digital patterns at sequencer rates and with patterns such that they match a selected compatible constellation. The demodulation algorithm, which processes the signal, calculates the resulting phase shifts and displays results. These results may conform to expected results or show irregularities in performance due to DUT imperfections such as missing or inaccurate state values. It should be noted that the DUT in embodiments of the present invention is acting only as a phase shifter embedded within the DUT comprised of several phase states, and not a strictly linear two port device such as an amplifier responding to pre-established modulation or to a signal generator producing a modulated signal into the DUT.

Figure 2:
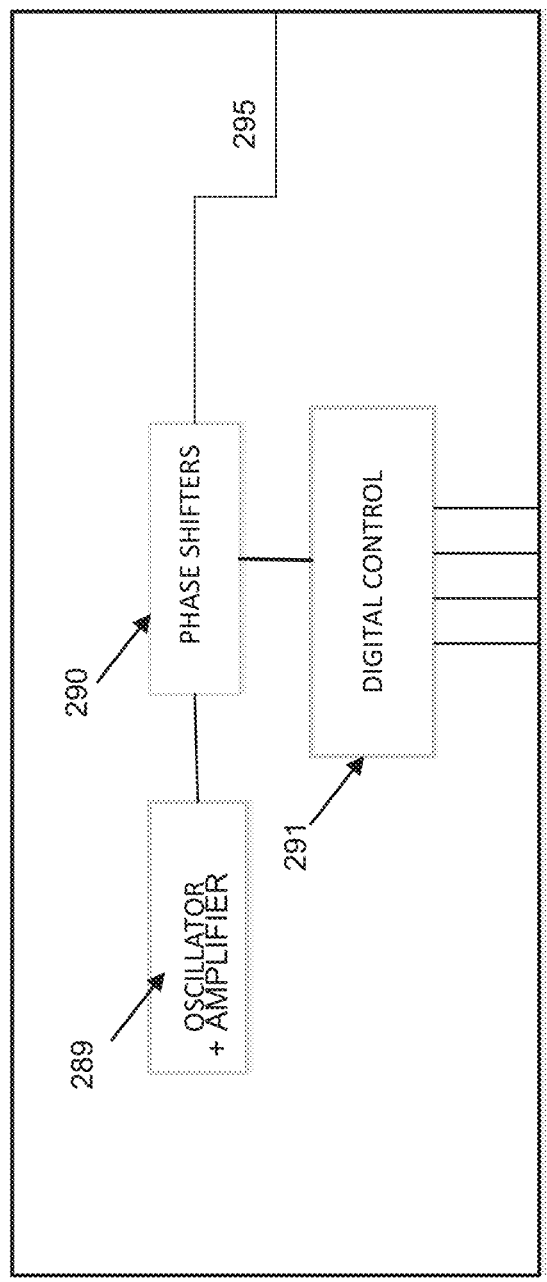
FIG. 2 is an exemplary block diagram of a DUT transmitter device used for instance in a radar application.

In one embodiment, as noted above, the phase characterization process of the present invention can be used for a transmitter device. FIG. 2 is an exemplary block diagram of a DUT transmitter device used for example in a radar application. A transmitter generates a continuous wave (CW) frequency output from the device 289 which is passed through the phase shift circuitry 290. A starting phase relationship is established when the ATE system and associated down converters establish a reference point. The phase shifters 290 in the transmitter circuitry are then manipulated using digital control patterns 291 on the device pins or by programmed sequences from registers internal to the device. As indicated above, in one embodiment, the present invention is implemented by manipulating the DUT by inputting various physical digital patterns into the control bits of the individual phase shifters in the device or through downloaded codes into registers of the device, wherein programming the device with downloaded codes can replicate external control. Although the device output 295 is at a millimeter or microwave frequency, it can be represented as I and Q baseband signals once down converted that will reflect the changing phase shifter settings. These baseband signals are analyzed with digital demodulation algorithms and the phase states are extracted. A significant advantage of this process is that the ATE does not need to provide any modulated sources.

Several of the simplest radar chipsets typically available in the market support two states, e.g., a 0 degree phase shift and a 180 degrees phase shift. For example, a two-phase state measurement is common to automotive radar device applications. A control line, e.g., using digital control module 291 to the phase shifter 290 toggles rapidly between two phase states at a rate creating a phase shift versus time sequence. The rate is solely dependent on what the device is capable of along with what is required to keep test time to a minimum. The captured results can be shown in a constellation format or the more common time domain format. Accordingly, in one embodiment of the present invention, ATE testing of phase states can apply common baseband processing algorithms. This processing is suitable in ATE applications for presenting the I Q waveforms in useful formats.

In one embodiment, the phase shifters of a DUT with CW output are rapidly changed to generate a simple two-state or binary phase shift keyed (BPSK) signal. The signal may be down converted as required from much higher frequencies to a system down converter (as shown in FIG. 1) that extracts the I and Q signals. These are manipulated with software processes in the ATE that extract the phase changes in the continuous wave signal. The extracted phase can then be shown as a visual display of the states (in time or as a constellation) and the ATE can record the results. The recorded result sought by the user is typically the phase shift introduced per bit relative to the "through" or zero degree state. Also, the ATE can be used to determine the uncertainty associated with each particular phase state. In other words, the ATE can be used to determine whether the intended phase shift from the toggling occurred and provide a record of the deviations from the expected value of the phase shift. The ATE can, therefore, analyze the resulting signal to determine how much the expected value of the phase shift deviated from the actual value as a result of noise or device errors.

A DUT that contains many discrete phase shifters or structures that produce a phase shift requires that each phase shift change be extracted and analyzed. The digital resources, e.g., digital control module 291 set one or more bits in patterns necessary to create increasing numbers of phase states.

Figure 3A:
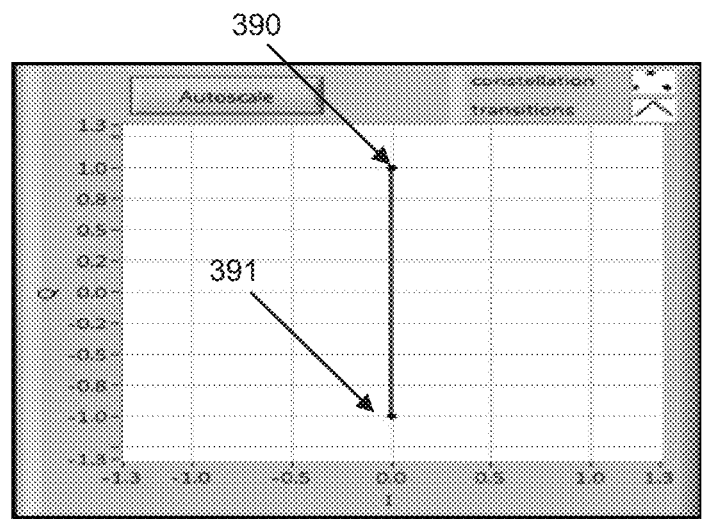
FIG. 3A illustrates a representative constellation of two phase states that be created by digital control of the phase states in a DUT transmitter in accordance with an embodiment of the present invention.
Figure 3B:
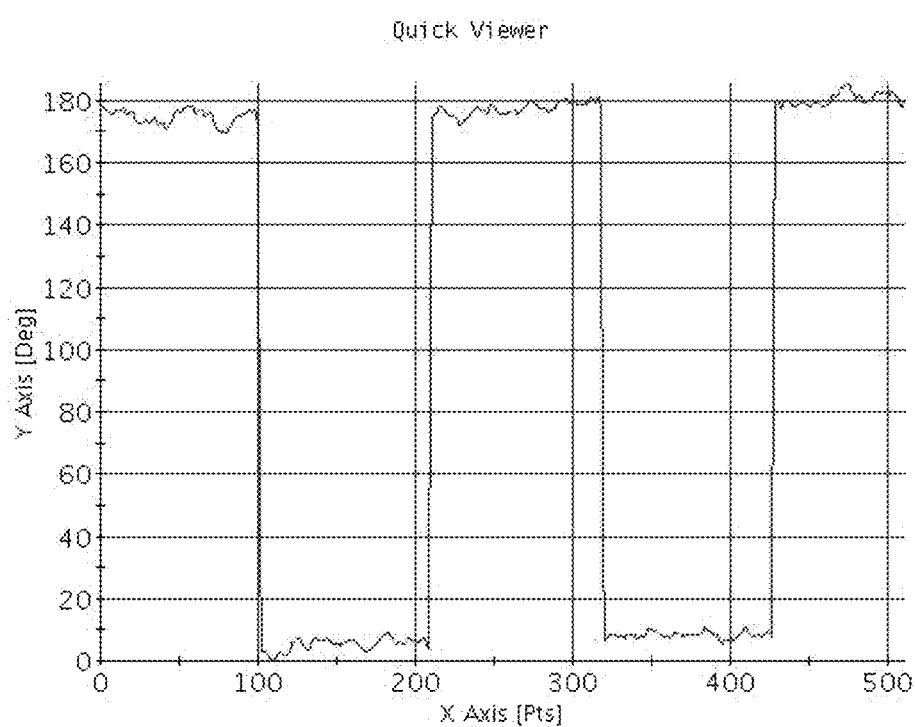
FIG. 3B illustrates a time-domain plot of the two phase states, wherein the time-domain plot corresponds to the representative constellation shown in FIG. 3A.

In one embodiment, the ATE can set a 0 degree phase shift and a 180 degree phase shift at the DUT transmitter's CW output. The absolute value of the state is generated along with the statistical distribution of each phase state's recorded results (e.g., a generated histogram). FIG. 3A illustrates a representative constellation of two phase states that be created by digital control of the phase states in a DUT transmitter in accordance with an embodiment of the present invention. The end points 391 and 390 indicate the 0 degree phase shift and the 180 degree phase shift respectively. FIG. 3B illustrates a time-domain plot of the two phase states, wherein the time-domain plot corresponds to the representative constellation shown in FIG. 3A. The results are processed and demonstrate the desired two states. It should be noted, however, that the actual phase state is not perfect and the distribution of small variations around each static value is of interest in deducing how much the expected value of the phase shift deviated from the actual value as a result of noise or device errors.

In one embodiment, the method discussed above can be enhanced further to demonstrate all the possible phase states the DUT may be capable of generating. A sequencer control pattern may set any arbitrary phase state at any useful rate required to represent the phase states in time. For a device with many possible phase states, in one embodiment, the sequencer control may be designed such that "pairs" of phase states are selected. FIG. 3B, for example, illustrates the phase relationship for a pair of states, wherein the pair of states is selected to be 180 degrees apart. Each pair out of all possible phase states that can be set for a 180 degree difference may be examined. The pairs are sequentially rotated through all possible remaining DUT states. Keeping the expected phase state 180 degrees apart of the many possible states provides an easy visual representation. For example, successive pairs can be 0/180 and 90/270.

More phase states can be processed applying the same methodology to DUTs having multiple phase shift elements. In one embodiment, DUTs may have 5-bit control structures (e.g., control modules 291 with 5-bit control signals) where a transmitter could produce an output with 32 discrete phase states. In other embodiments, the DUTs may have more complex control structures with a higher number of bits where more phase states can be set individually or severally in any combination of pairs, sets, or groups. Typically however, only the major bits are tested to confirm the incremental value of each control bit relative to a reference state—"000000"—all ZEROs for example on the control lines.

Figure 4:
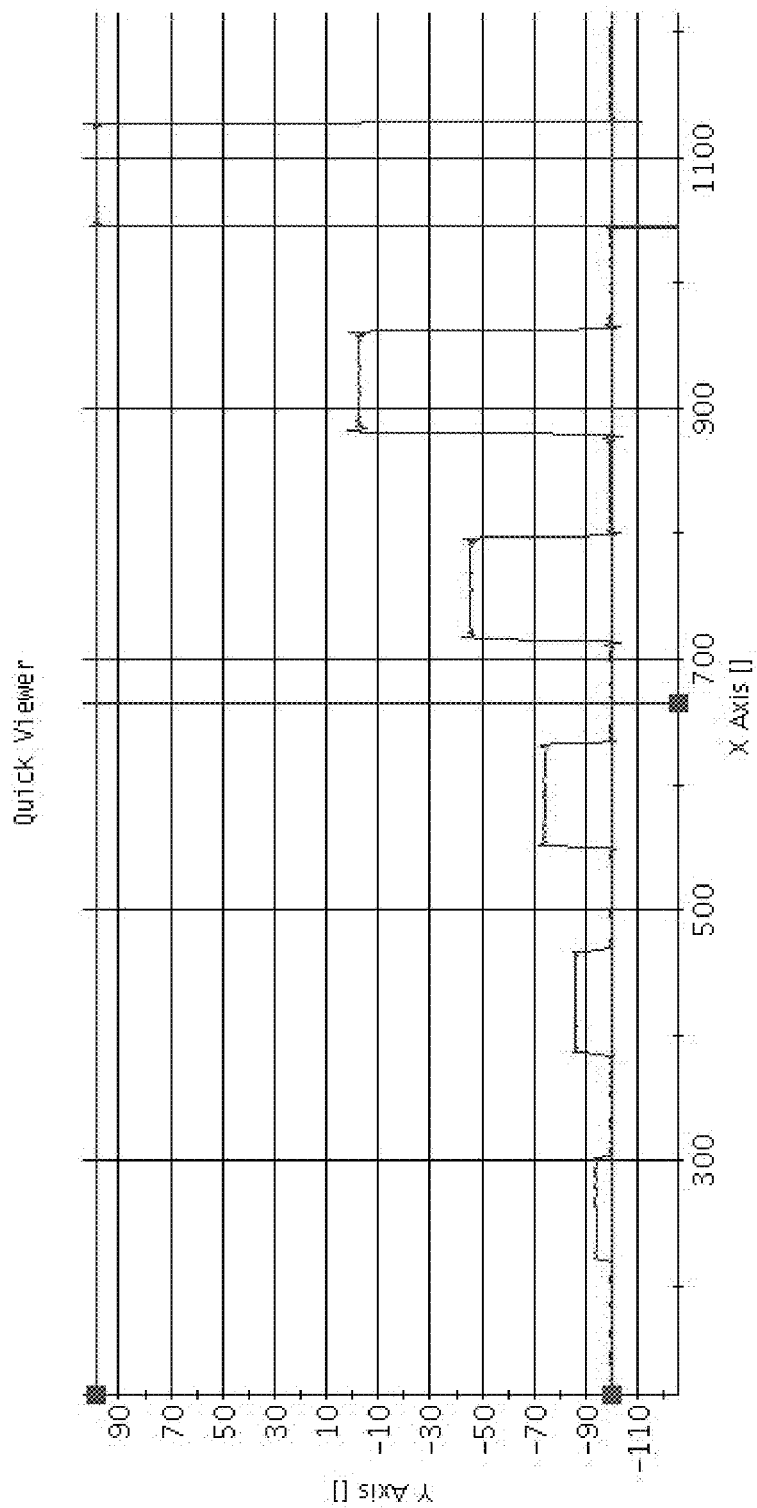
FIG. 4 shows major phase states alternating with a reference Thru in accordance with an embodiment of the present invention.

FIG. 4 shows major phase states alternating with a reference Thru in accordance with an embodiment of the present invention. Thru corresponds to a reference plane set in accordance with the Thru standard. Each phase state illustrated in FIG. 4 represents a major bit in the programming sequence. The capture time is set based on the number of samples desired per phase state and the device response. A Thru phase is measured in between each major phase state shown in FIG. 4.

Figure 5A:
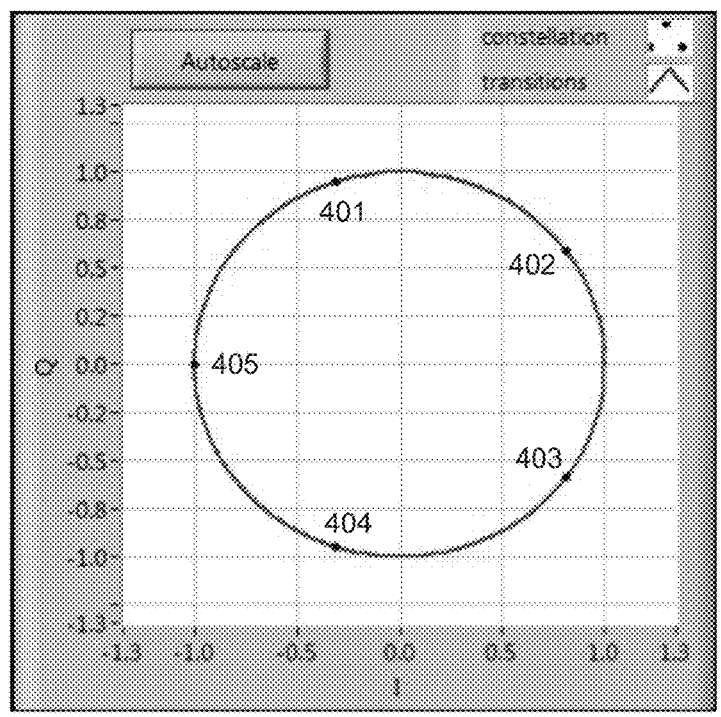
FIG. 5A illustrates an example wherein digital control of the phase states can create a constellation of 5 phase states in accordance with an embodiment of the present invention.
Figure 5B:
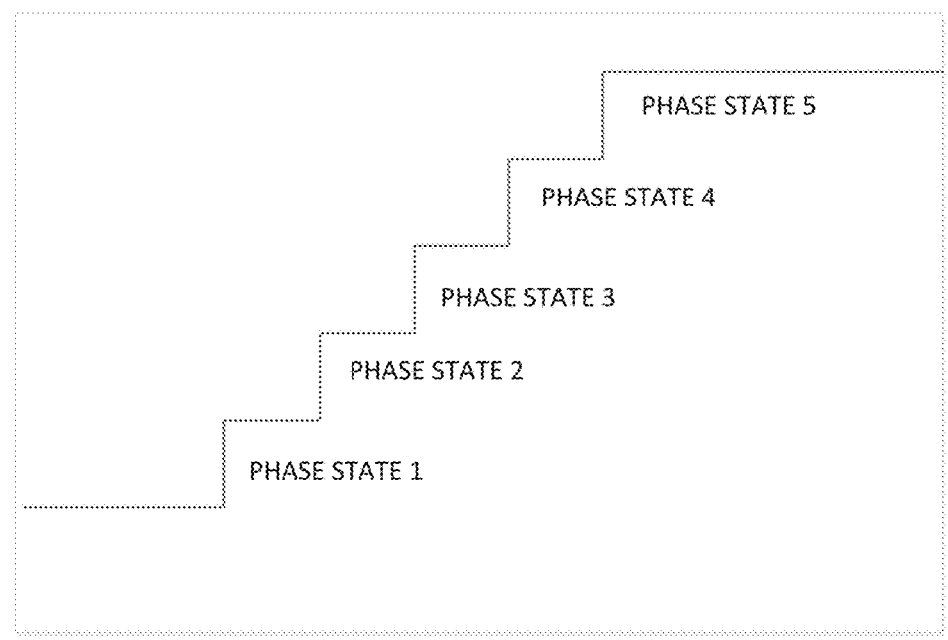
FIG. 5B illustrates a time-domain plot of the phase states in accordance with an embodiment of the present invention, wherein the time-domain plot corresponds to the representative constellation shown in FIG. 5A.

FIG. 5A illustrates an example wherein digital control of the phase states can create a constellation of 5 phase states in accordance with an embodiment of the present invention. The resulting constellation shows five discrete states (e.g., 401, 402, 403, 404 and 405 as shown in FIG. 4A). It should be noted that the constellation illustrated in FIG. 4A indicates only static positions. FIG. 5B illustrates a time-domain plot of the phase states in accordance with an embodiment of the present invention, wherein the time-domain plot corresponds to the representative constellation shown in FIG. 5A. The time-domain plot of FIG. 5B indicates that the states are controlled in such a manner that the phase accumulates over the increasing time interval.

Receivers

Figure 6:
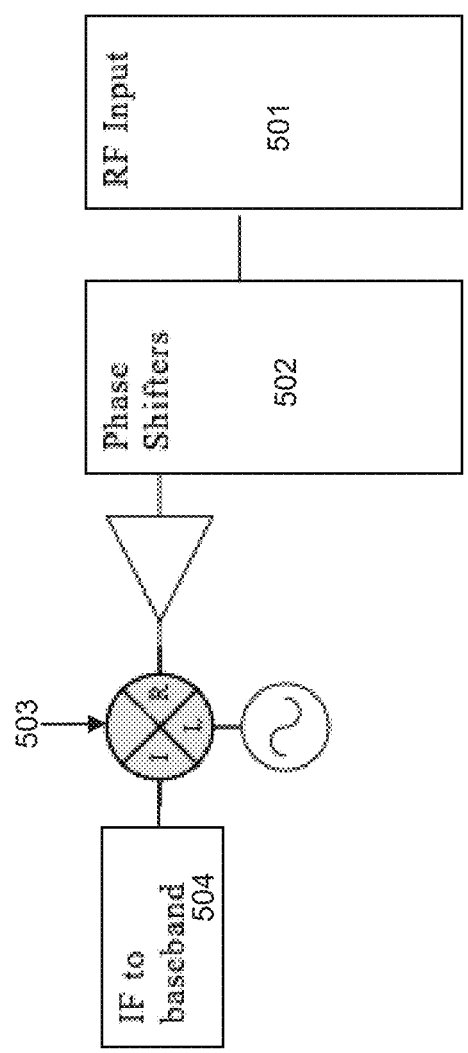
FIG. 6 is an exemplary block diagram of a DUT receiver device used for example in a radar application.

FIG. 6 is an exemplary block diagram of a DUT receiver device used for example in a radar application. The phase shifters in a DUT receiver can also be tested in a similar manner as a DUT transmitter. A CW input signal requiring no modulation is applied to the device using RF input module 501. The phase shifter 502 that creates differing phase states, for example a 0 degree and 180 degree phase shift, is driven by an external digital pin driving the RF input module 501. The resulting phase modulation is down converted by the DUT using down converter module 503 to either an IF or baseband signal 504. The IF or baseband signal 504 coming from the DUT can be further down converted if needed or its output directly processed to extract the results.

FIG. 3A also illustrates an exemplary constellation of two phase states that be created by digital control of the phase states in a DUT receiver using the external digital pin in accordance with an embodiment of the present invention. FIG. 3B illustrates the corresponding exemplary time domain output of this signal, which is a known phase modulation (BPSK). The constellation, shown in FIG. 3A, confirms only two states are occurring and they are 180 degrees apart.

Figure 7:
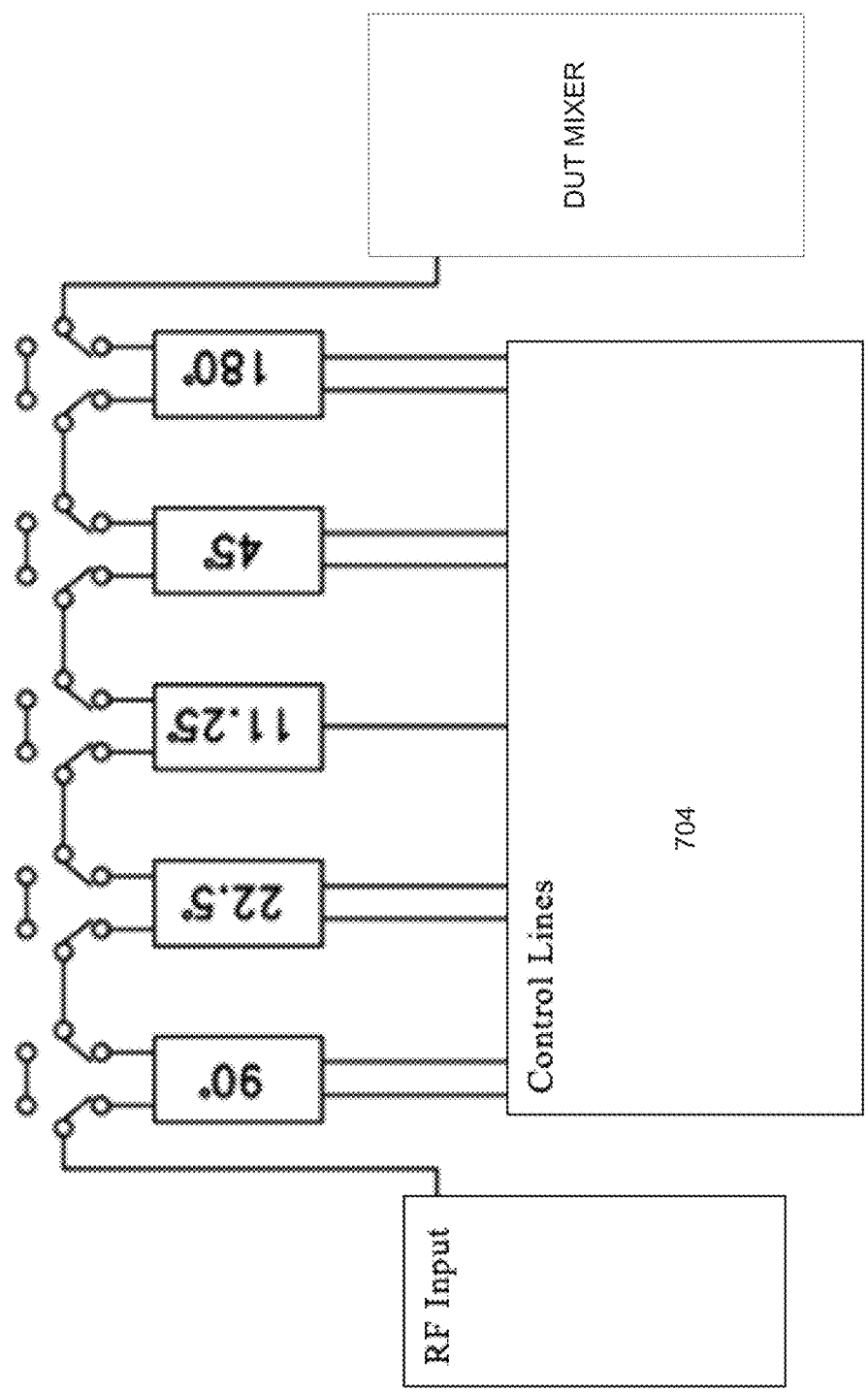
FIG. 7 is an exemplary diagram of an input portion of the receiver wherein the phase shifter is indicated as a discrete element with 5-bit control signals.

FIG. 7 is an exemplary diagram of an input portion of the receiver wherein the phase shifter is indicated as a discrete element with 5-bit control signals. FIG. 7 is a more detailed diagram for phase shifter 502 in FIG. 6. This device, the phase shifter, is shown as a discrete component with 5-bit control signals. The embodiments of the present invention can be used to characterize these multi-state phase devices, wherein the input CW signal can be rotated by a multi-phase phase shifter, down converted by the DUT itself to an IF appropriate for the ATE digitizer, as will be discussed in relation to FIG. 8.

Figure 8:
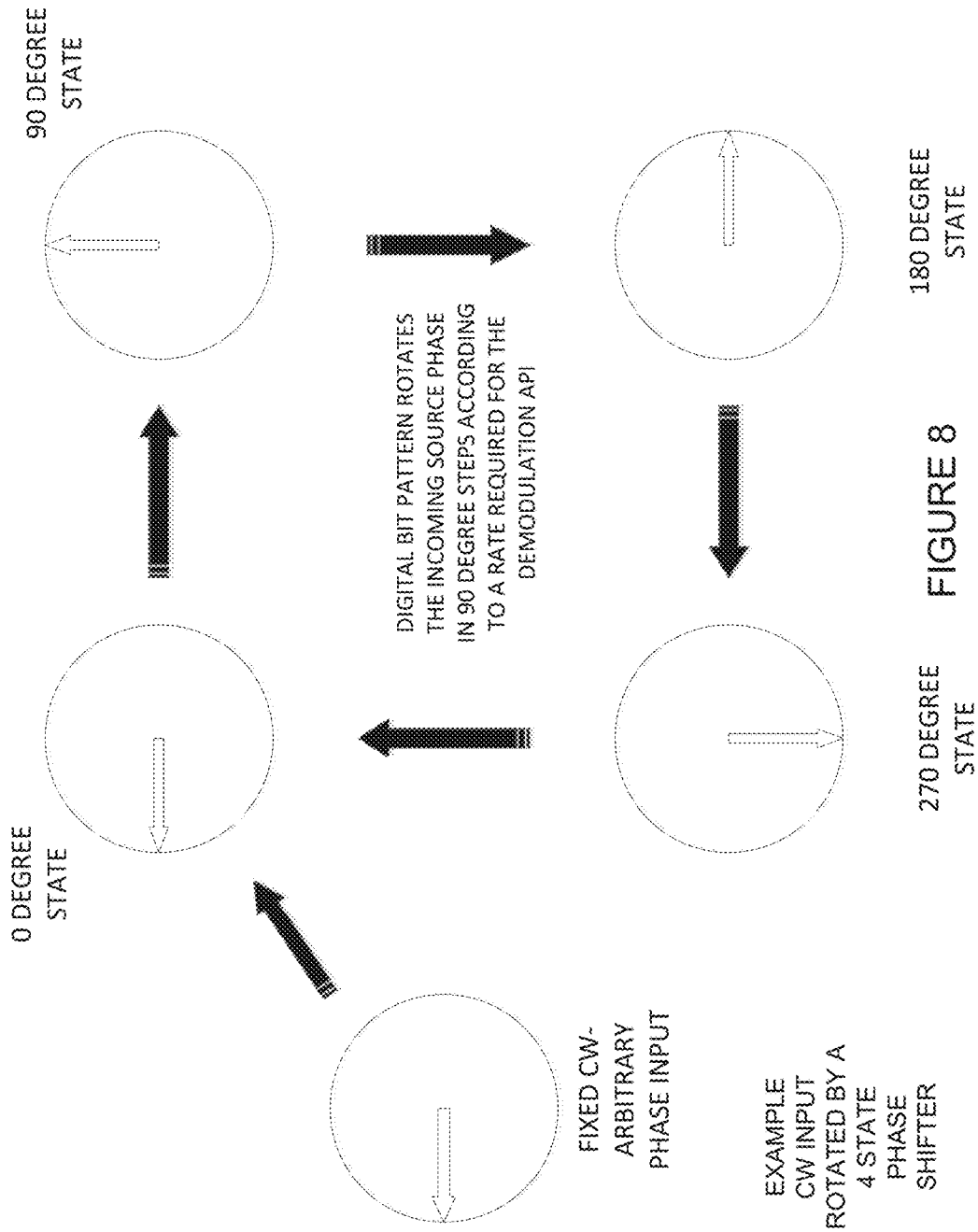
FIG. 8 illustrates exemplary constellations resulting from a fixed CW arbitrary phase input wherein the digital bit control pattern rotates the incoming source phase in 90 degree steps in accordance with an embodiment of the present invention.

FIG. 8 illustrates exemplary constellations resulting from a fixed CW arbitrary phase input wherein the digital bit control pattern rotates the incoming source phase in 90 degree steps in accordance with an embodiment of the present invention. FIG. 8 illustrates a fixed CW input frequency that starts at an arbitrary phase relationship relative to the ATE reference phase. The control lines 704, as shown in FIG. 7, are selected to create four discrete phase states—0 deg, 90 deg, 180 deg, 270 deg (QPSK signal). The receiver output is connected to the ATE system downconverter. A starting phase is established relative to the ATE clock reference in the down converter and digitizer. The digital bit pattern inputted through control lines 704 rapidly toggle which rotates the incoming source phase in 90 degree increments according to a rate suitable for the device operation and in range of the bandwidth of the ATE.

Embodiments of the present invention advantageously reduce test time by increasing numbers of phase shift states that are extracted from the resulting externally phase modulated (by digital sequencers) signal stream. For example, digital control sequenced sets of four phase states (from many sets) 90 degrees apart (corresponding to QPSK) may be extracted and demodulated for the results. This reduces test time since more states (four at a time) are tested simultaneously.

Figure 9:
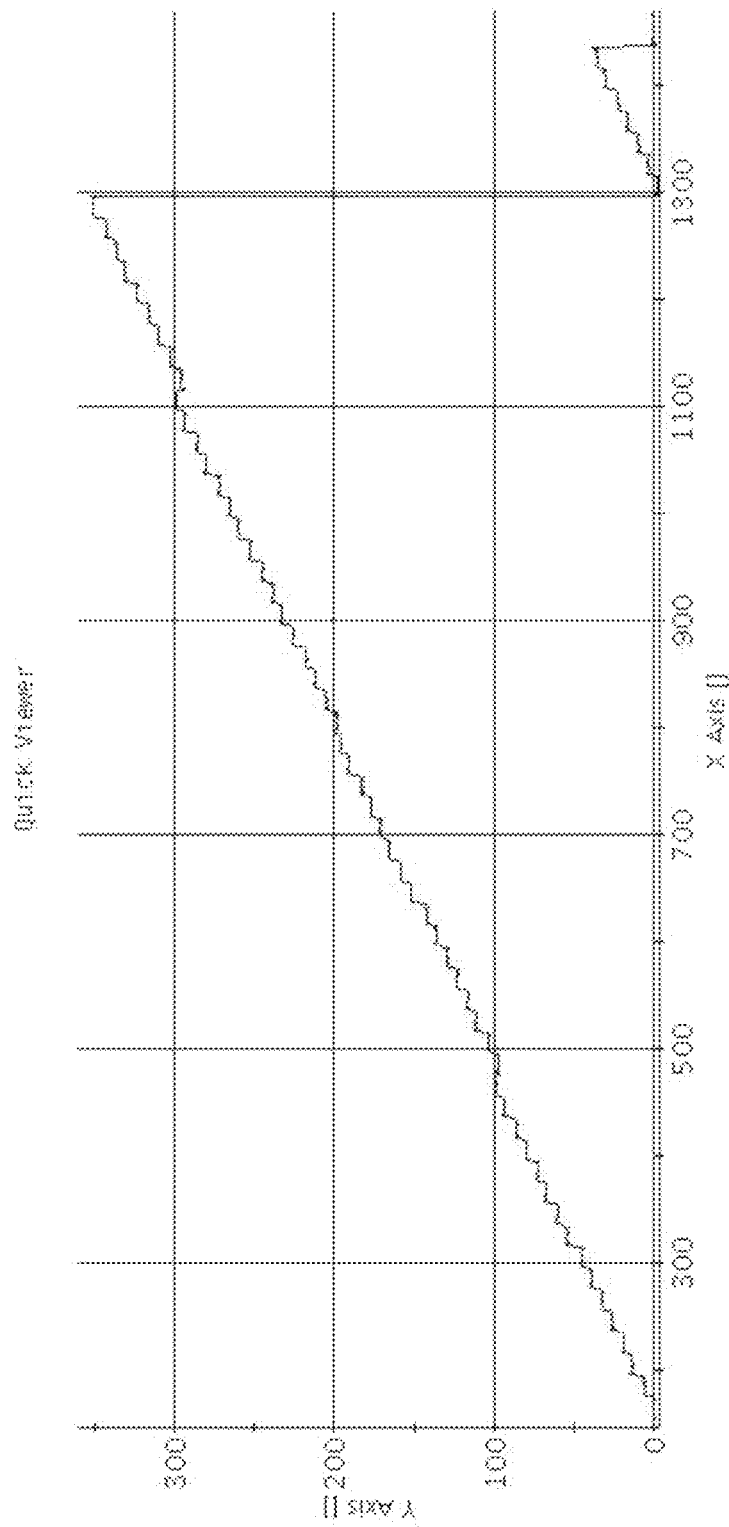
FIG. 9 illustrates a ramp of a 6-bit phase shifter and all possible combinations of phase settings in accordance with an embodiment of the present invention.

A ramp of phase states indicating the smallest increment of the phase may also be useful and possible. FIG. 9 illustrates a ramp of a 6-bit phase shifter and all possible combinations of phase settings in accordance with an embodiment of the present invention. A 6-bit phase shifter results in a full range ramp comprising 64 states as shown in FIG. 9.

Figure 10:
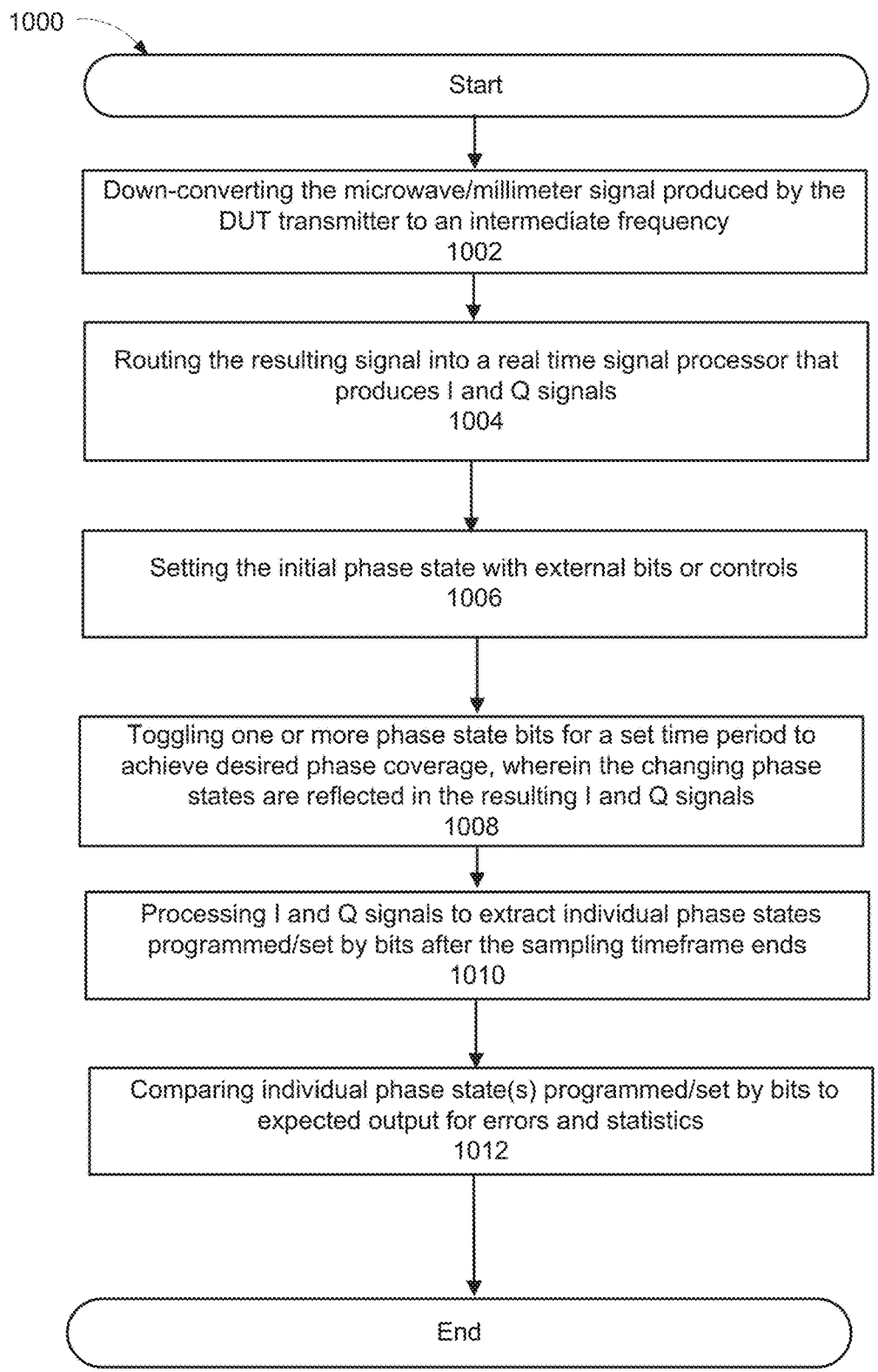
FIG. 10 is a flowchart of an exemplary method of characterizing a phase shifter in a transmitter device in accordance with embodiments of the present disclosure.

FIG. 10 is a flowchart of an exemplary method of characterizing a phase shifter in a transmitter device in accordance with embodiments of the present disclosure. The disclosure, however, is not limited to the description provided by flowchart 1000. Rather, it will be apparent to persons skilled in the relevant art(s) from the teachings provided herein that other functional flows are within the scope and spirit of the present disclosure. Flowchart 1000 will be described with continued reference to exemplary embodiments described above, though the method is not limited to those embodiments.

At step 1002, the millimeter (or microwave) signal produced by the DUT transmitter is down-converted to an intermediate frequency because of the high frequencies, e.g., over 80 GHz, involved at the millimeter/microwave frequency range.

At step 1004, the resulting intermediate frequency (IF) signal is routed to a real time signal processor that will produce I and Q signals. The real time signal processor is typically part of the core ATE digitizer.

At step 1006, the initial phase state is set for the phase shifter on the DUT transmitter using external bits or controls. As discussed above, a starting phase relationship is established when the ATE system and associated down converters establish a reference point. The phase shifters 290 in the transmitter circuitry are then manipulated using digital control patterns 291 on the device pins or by programmed sequences from registers internal to the device (as shown in FIG. 2).

At step 1008, the ATE digitizer is started and one or more of the phase state bits are toggled for a set time period to produce the desired phase coverage/range, wherein the changing phase states are reflected in the I and Q signals. As indicated above, in one embodiment, the present invention is implemented by manipulating the DUT by inputting various physical digital patterns into the control bits of the individual phase shifters in the device or through downloaded codes into registers of the device, wherein programming the device with downloaded codes can replicate external control.

At step 1010, the I and Q signals are processed to extract individual phase states that are programmed/set by the bits after the sampling timeframe ends.

Finally, at step 1012, the individual phase states programmed/set by the desired phase state bits to an expected output are compared to determine errors and statistics in order to characterize the transmitter phase shifter(s).

Figure 11:
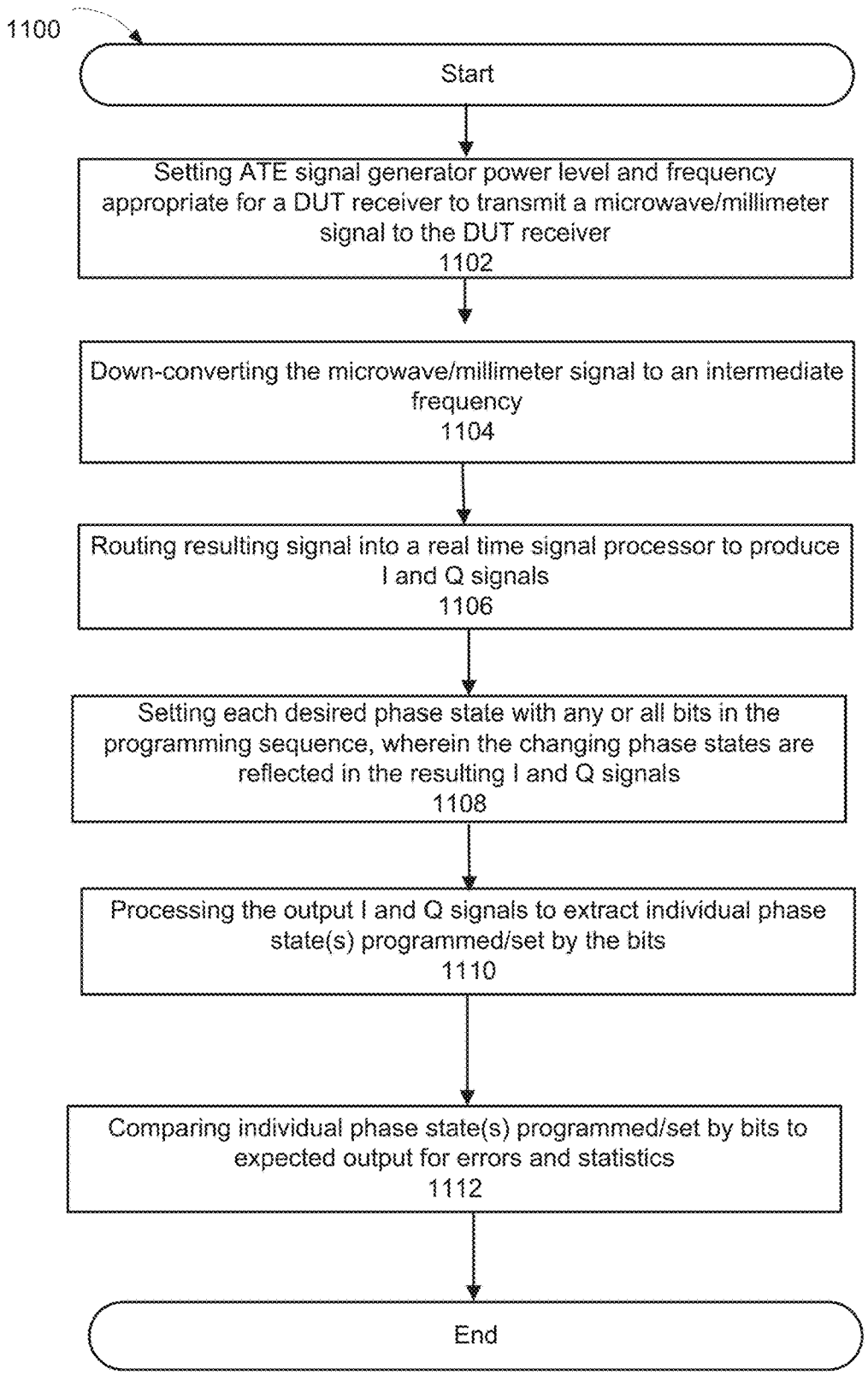
FIG. 11 is a flowchart of an exemplary method of characterizing a phase shifter in a receiver device in accordance with embodiments of the present disclosure.

FIG. 11 is a flowchart of an exemplary method of characterizing a phase shifter in a receiver device in accordance with embodiments of the present disclosure. The disclosure, however, is not limited to the description provided by flowchart 1100. Rather, it will be apparent to persons skilled in the relevant art(s) from the teachings provided herein that other functional flows are within the scope and spirit of the present disclosure. Flowchart 1100 will be described with continued reference to exemplary embodiments described above, though the method is not limited to those embodiments.

At step 1102, the ATE signal generator power level and frequency is set that is appropriate for a DUT receiver. The ATE signal generator transmits the CW signal to the RF input module 501 of the DUT receiver (as shown in FIG. 6).

At step 1104, the millimeter (or microwave) signal produced by the ATE signal generator is down-converted to an intermediate frequency because of the high frequencies, e.g., over 80 GHz, involved at the millimeter/microwave frequency range.

At step 1106, the resulting intermediate frequency (IF) signal is routed to a real time signal processor that will produce I and Q signals. The real time signal processor is typically part of the core ATE digitizer.

At step 1108, the desired phase states are set on the phase shifter with any or all bits in the programming sequence, wherein the programming sequence is input into the control bits of the phase shifter. Again, the control bits can be external controls or sequences programmed directly into the internal control registers of the DUT. As discussed above, for example, the phase shifter 502 that creates differing phase states, for example a 0 degree and 180 degree phase shift, is driven by an external digital pin driving the RF input module 501. The changing phase states are reflected in the I and Q signals.

At step 1110, the I and Q signals are processed to extract individual phase states that are programmed/set by the bits after the sampling timeframe ends.

Finally, at step 1112, the individual phase states programmed/set by the phase state bits to an expected output to determine errors and statistics in order to characterize the transmitter phase shifter(s).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method of characterizing a phase shifter in a transmitter device under test (DUT) using automated test equipment (ATE), the method comprising:
   down converting an input signal received from the transmitter DUT to an intermediate frequency;
   routing the down converted input signal to a signal processor, wherein the signal processor generates I and Q signals using the input signal;
   setting an initial phase state on the phase shifter in the transmitter DUT;
   toggling at least one phase state bit to control the phase shifter to cycle through a plurality of phase states, wherein changing phase states appear on the I and Q signals; and
   characterizing the phase shifter, wherein the characterizing comprises processing the I and Q signals to extract individual phase states programmed by the at least one phase state bit.

2. The method of claim 1, wherein the at least one phase state bit is input to the phase shifter using external control pins connected to the phase shifter.

3. The method of claim 1, wherein the at least one phase state bit is input to the phase shifter using codes downloaded into registers of the transmitter DUT.

4. The method of claim 1, further comprising:
   comparing the individual phase states programmed by the at least one phase state bit to an expected output to determine deviations therefrom.

5. The method of claim 1, further comprising:
   creating a visual indication of extracted individual phase states using a format selected from a group consisting of: a constellation format and a time domain format.

6. The method of claim 1 wherein the input signal is at a millimeter frequency.

7. The method of claim 1, wherein the signal processor is part of a digitizer in the ATE, and wherein the toggling is performed by digital pin electronics in the ATE.

8. The method of claim 1, wherein the processing comprises analyzing the I and Q signals using digital demodulation processes.

9. A method of characterizing a phase shifter in a receiver device under test (DUT) using automated test equipment, the method comprising:
   setting an ATE signal generator power level and frequency to transmit an input signal to the receiver DUT;
   down converting the input signal received to an intermediate frequency;
   routing the down converted input signal to a signal processor, wherein the signal processor generates I and Q signals using the input signal;
   setting at least one phase state bit to control the phase shifter to cycle through a plurality of phase states, wherein changing phase states appear on the I and Q signals; and
   characterizing the phase shifter, wherein the characterizing comprises processing the I and Q signals to extract individual phase states programmed by the at least one phase state bit.

10. The method of claim 9, wherein the at least one phase state bit is input to the phase shifter using external control pins connected to the phase shifter.

11. The method of claim 9, further comprising:
    comparing the individual phase states programmed by the at least one phase state bit to an expected output to determine deviations therefrom.

12. The method of claim 9, further comprising:
    creating a visual indication of the extracted individual phase states using a format selected from a group consisting of: a constellation format and a time domain format.

13. The method of claim 9 wherein the input signal is at a millimeter frequency.

14. An Automated Test Equipment (ATE) system, the system comprising:

a non-transitory memory comprising instructions stored therein, wherein the instructions are operable to characterize a phase shifter in a transmitter device under test (DUT);

a processor coupled to the memory, the processor configured to operate in accordance with the instructions to:

down convert an input signal received from the transmitter DUT to an intermediate frequency;

route the down converted input signal to a signal processor, wherein the signal processor generates I and Q signals using the input signal;

set an initial phase state on the phase shifter in the transmitter DUT;

toggle at least one phase state bit to control the phase shifter to cycle through a plurality of phase states, wherein changing phase states appear on the I and Q signals; and characterize the phase shifter by processing the I and Q signals to extract individual phase states programmed by the at least one phase state bit.

15. The system of claim 14, wherein the processor is further configured to:

compare the individual phase states programmed by the at least one phase state bit to an expected output to determine deviations therefrom.

16. The system of claim 14, wherein the processor is further configured to:

create a visual indication of the extracted individual phase states using a format selected from a group consisting of: a constellation format and a time domain format.

17. The system of claim 14, wherein the at least one phase state bit is input to the phase shifter using external control pins connected to the phase shifter.

18. The system of claim 14, wherein the at least one phase state bit is input to the phase shifter using codes downloaded into registers of the transmitter DUT.

19. An Automated Test Equipment (ATE) system, the system comprising:

a non-transitory memory comprising instructions stored therein, wherein the instructions are operable to characterize a phase shifter in a receiver device under test (DUT);

a processor coupled to the memory, the processor configured to operate in accordance with the instructions to:

set an ATE signal generator power level and frequency to transmit an input signal to the receiver DUT;

down convert an input signal an intermediate frequency;

route the down converted input signal to a signal processor, wherein the signal processor generates I and Q signals using the input signal;

set at least one phase state bit to control the phase shifter to cycle through a plurality of phase states, wherein changing phase states appear on the I and Q signals; and characterize the phase shifter by processing the I and Q signals to extract individual phase states programmed by the at least one phase state bit.

20. The system of claim 19, wherein the processor is further configured to:

compare the individual phase states programmed by the at least one phase state bit to an expected output to determine deviations therefrom.

* * * * *